United States Patent

White

[15] 3,675,083

[45] July 4, 1972

[54] UNIVERSAL BUS ARRANGEMENT FOR DATA PROCESSING SYSTEMS

[72] Inventor: Donald A. White, Westminster, Mass.

[73] Assignee: Digital Equipment Corporation, Maynard, Mass.

[22] Filed: Sept. 14, 1970

[21] Appl. No.: 72,092

[52] U.S. Cl. ....................317/101, 339/17 LM, 339/176 MP
[51] Int. Cl. ....................H05k 1/02
[58] Field of Search ................339/17 L, 17 LM, 17 M, 17 R, 339/176 M, 176 MP; 174/68.5; 317/101 D, 101 DH

[56] References Cited

UNITED STATES PATENTS

| | | | |
|---|---|---|---|
| 3,496,514 | 2/1970 | Gallentine | 339/17 L |
| 3,543,226 | 11/1970 | La Bove | 339/176 MP |
| 3,470,421 | 9/1969 | Shore et al. | 339/17 L X |
| 3,015,755 | 1/1962 | Wright et al. | 339/17 LM X |
| 3,001,171 | 9/1961 | Schultz | 339/17 LM X |

FOREIGN PATENTS OR APPLICATIONS

| | | | |
|---|---|---|---|
| 1,143,559 | 2/1963 | Germany | 339/17 L |

OTHER PUBLICATIONS

Article from Electrical Manufacturing Magazine, Nov., 1959 issue, pgs. 133- 135. " Standard Modular System for Transistorized Computers" by A. H. Johnson

*Primary Examiner*—Marvin A. Champion
*Assistant Examiner*—Terrell P. Lears
*Attorney*—Cesari and McKenna

[57] ABSTRACT

An arrangement for interconnecting circuit boards in a data processing system. Signals are coupled to and from individual circuit boards over contacts formed on the boards. Corresponding contacts on each board are reserved for a specific signal. In use, the boards are inserted in connector blocks which have corresponding terminal pins in circuit with the individual contacts. Another circuit board supports each connector block. Conductors on this board connect corresponding terminal pins on all the connector blocks in parallel so that any individual circuit board can be inserted in any connector block.

4 Claims, 6 Drawing Figures

UNIVERSAL BUS ARRANGEMENT FOR DATA PROCESSING SYSTEMS

BACKGROUND OF THE INVENTION

This invention is generally related to data processing systems and more specifically to means for interconnecting circuits in such data processing systems.

Data processing systems comprise groups of electrical components which are arranged to perform specific functions with respect to particular electrical signals. Most of these components, including resistors, transistors and other solid state devices, and integrated circuits, are mounted on individual printed circuit boards. The phrase "module board" defines such a printed circuit board and its mounted components in the following discussion.

A given module board might include several such circuits to perform several functions. For example, a single module board might include the components for a portion of the arithmetic unit or for a register memory in a data processing system. Normally, a data processing system, then, comprises several module boards; and contacts along the edge of each module board couple signals to or from that board.

Commonly, a connector block supports one or more module boards in the data processing system. Each connector block comprises a plurality of rearwardly extending terminal pins which are in circuit with contacts on an inserted module board.

Individual conductors interconnect various terminal pins to route signals among the various module boards in present data processing systems. These interconnecting conductors are usually soldered to or wrapped around the individual terminal pins. Where a minimal amount of interconnection is necessary, another printed circuit board may join randomly located terminal pins. All these prior approaches constitute point-to-point wiring and are characterized by several problems and limitations.

Once the terminal pins on different connector blocks are wired, the module boards cannot be moved. This complicates circuit board installation because each module board must be properly located.

Related module boards, such as those constituting the arithmetic unit, normally reside in adjacent locations and are closely spaced. As a result, many of the module boards are inaccessible for testing purposes; so a person testing the module boards must remove the board and test it out of the system or insert an intermediate extender board because the module board cannot be moved to another position in the data processing system. The extender board comprises contacts for insertion in the system connector block and a connector for accepting the module board being tested with conductors interconnecting the contacts and the connector. This makes the module board more accessible for testing.

Manufacturing problems also result when point-to-point wiring is used. Most manufactures use expensive and automated machinery to connect the conductors and pins. Even when hand wiring is used, errors often occur because the pins are in close proximity and easily confused.

Therefore, it is an object of this invention to provide a data processing system in which module boards can be randomly located.

It is another object of this invention to provide a data processing system wherein testing procedures for module boards are simplified.

Yet another object of this invention is to provide a data processing system in which the interconnection of individual module boards is simplified.

SUMMARY

In accordance with this invention, module boards comprise a plurality of contacts which engage connector blocks. Corresponding contacts in a specific location on all module boards are reserved for the same signal so corresponding terminal pins on the connector blocks and in circuit with the contacts are also reserved for the same signal. Another circuit board supports the connector blocks so electrically corresponding terminal pins are aligned. Conductors on this circuit board electrically connect all corresponding terminal pins. As a result, a module board can operate in any connector block location.

This invention is pointed out with particularity in the appended claims. A more thorough understanding of the above and further objects and advantages of this invention may be attained by referring to the following detailed description taken in conjunction with the accompanying drawings.

DESCRIPTION OF AN ILLUSTRATIVE EMBODIMENT

In accordance with this invention, a module board has a plurality of contact locations along one edge. Each location is reserved for a specific signal and a corresponding location on all the module boards is reserved for the same signal. For example, a first contact location on each module board might be reserved for a particular supply voltage, while another location is reserved for a specific gating pulse. Each module board has contacts formed at the locations for carrying signals involving that module board. Otherwise, the contacts are usually omitted.

When the module boards are inserted into the connector blocks, all corresponding contacts are interconnected because each set of corresponding terminal pins is interconnected and connected to corresponding contacts on each module board. As a result, a signal from any module board is transferred to all connector board blocks through a corresponding terminal pin on each block. The signal is thereby transferred to all other module boards having a contact formed at the corresponding location.

It is now apparent that this interconnection arrangement facilitates the installation of module boards. No unique module board locations exist. This arrangement also facilitates testing because a malfunctioning module board in a cluster can be relocated in a vacant position. This enables test leads to be connected directly to the various test points on the board and to allow in situ testing.

It is also apparent that the number of contact locations on each module board must be increased when this invention is implemented. One contact location must be reserved for each different signal which must be interconnected between any two boards. Since any single board normally responds to fewer than all the interconnected signals, each module board contains unused contact locations. Further, increased module board sizes are necessary to accept the increased number of contact locations. However, it has been found that the installation, testing and manufacturing advantages achieved by implementing this invention outweigh these apparent disadvantages.

Figures 1, 2, 3, 4:
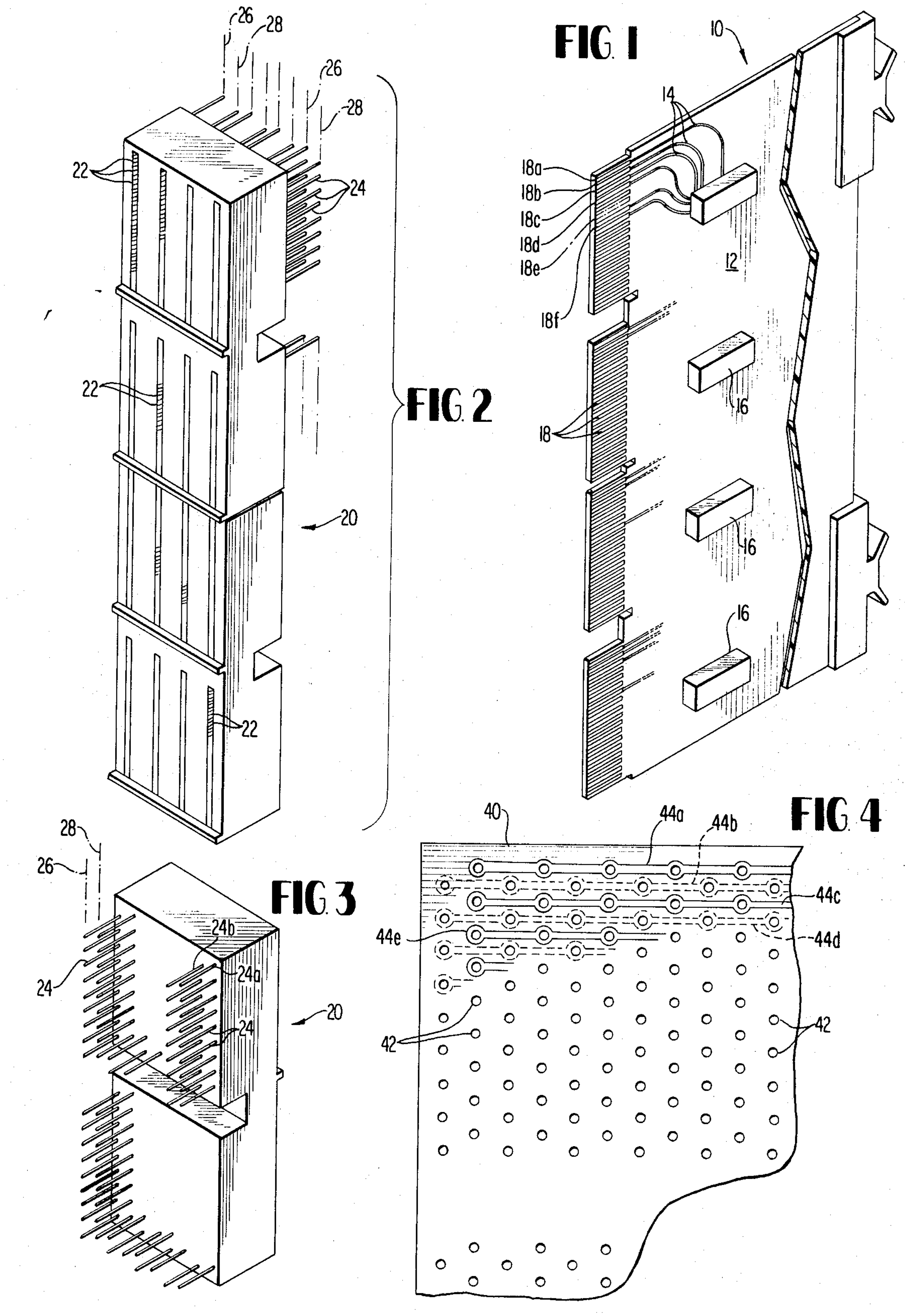
FIG. 1 is a perspective view of a module board used in data processing systems.
FIG. 2 is a perspective view of a connector block for receiving a module board such as shown in FIG. 1.
FIG. 3 is another perspective view of a portion of the connector block shown in FIG. 2.
FIG. 4 illustrates a back circuit board for interconnecting connector blocks in accordance with this invention.

With reference to the FIG. 1, a typical module board 10 comprises a printed circuit board 12 with a plurality of conductive layers 14 soldered to components 16 so that the components 16 perform some function. These module boards are well known in the art.

Each signal, be it a supply voltage, a gating pulse or other signal, has a specifically reserved contact location on the printed circuit board 12. In the contact portion 18 along one edge of the printed circuit board, contacts 18a, 18b and 18c might be reserved for power supply voltages. Contact 18d could be an electrical ground, while the location 18e might be reserved for a gating pulse. As there is no contact at the location 18e of the printed circuit board 12 shown in the FIGURE this module board does not generate or use that gating pulse.

FIGS. 2 and 3 show a connector block for the module boards. A row of contact fingers 22 at the front of the connector block 20 engages the contacts 18 of an inserted module board. Each contact finger 22 is in circuit with one of a plurality of terminal pins 24 which extend from the rear of the block 20. With most connector blocks, the contact fingers 22 are aligned to accept the planar module boards and engage the contacts 18, while terminal pins 24 connected to adjacent contact fingers are offset to form a pair of staggered pin rows 26 and 28 for each module board. This arrangement increases the terminal pin spacing and is known in the art.

Figure 5:
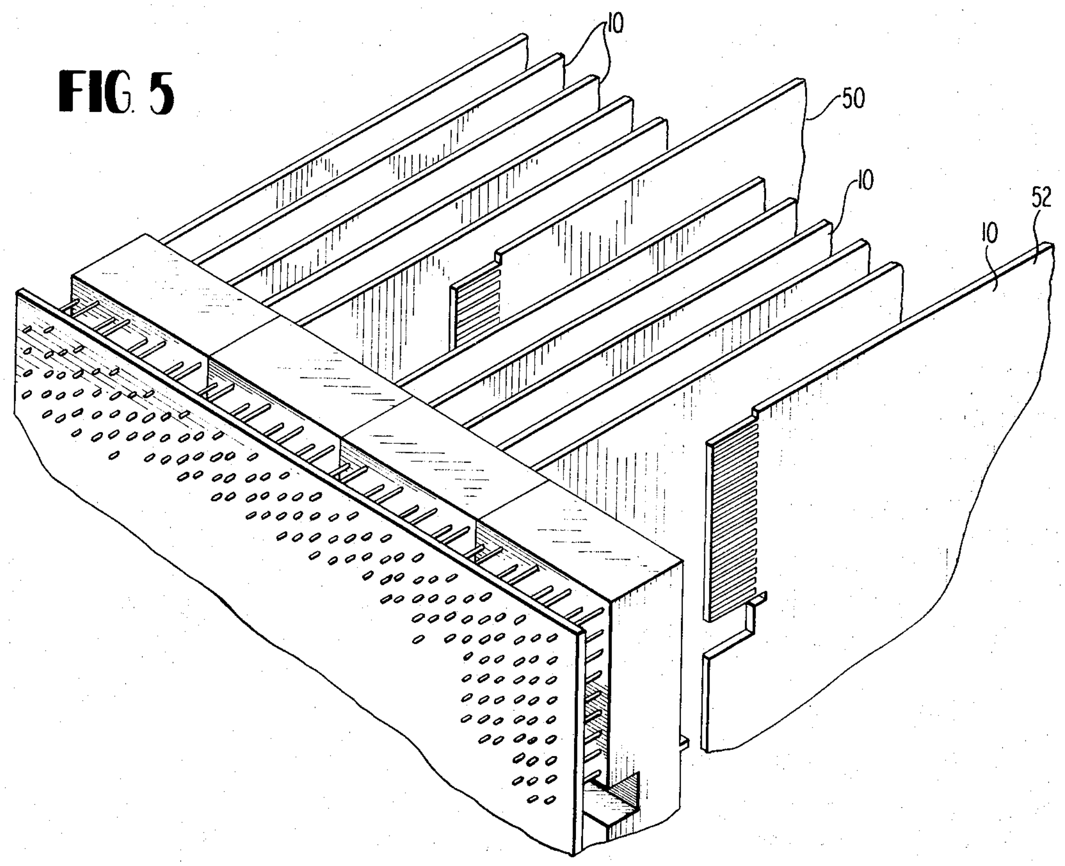
FIG. 5 is a perspective view of an assembled back circuit board, connector blocks and module boards.
Figure 6:
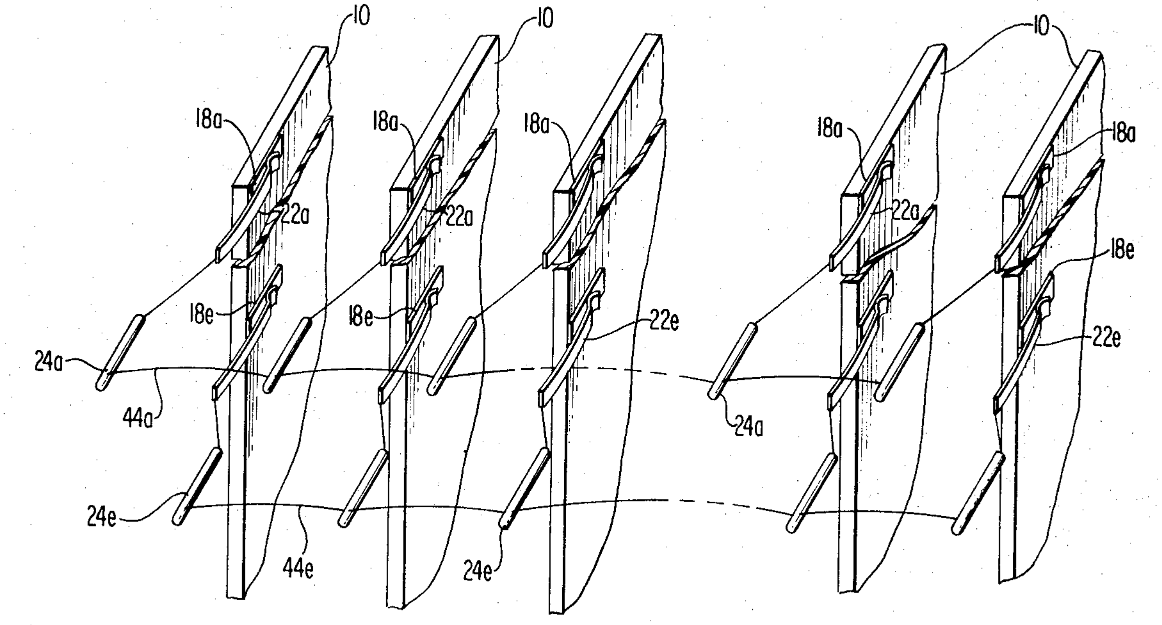
FIG. 6 schematically illustrates how the back circuit board interconnects the module boards in accordance with this invention.

A back circuit board 40, FIG. 4, replaces the prior point-to-point wiring. It supports all the connector blocks 20. The terminal pins 24 pass through apertures 42 in the board 40 as shown in FIGS. 4 and 5. The back circuit board 40 also includes a plurality of conductive layers 44 on each plane or surface. Each conductive layer is soldered to all corresponding terminal pins. For example, the layer 44a (FIG. 6) is soldered to all terminal pins corresponding to terminal pin 24a. Another conductive layer 44b on the other side of the back circuit board 40 connects all the terminal pins corresponding to terminal pin 24b. Hence, as shown in FIG. 6, if one module board generates a gating pulse at the contact 18e, the pulse passes through a connector block and terminal pin onto the conductive layer 44e. If any other module has a contact at a position corresponding to the contact 18e, it receives the gating pulse regardless of its location because a corresponding contact finger in each connector block is energized by this pulse. In this specific context, the module board in FIG. 1 would not receive the gating pulse.

As is now apparent, the location of a specific module board is not important because any module board can be inserted in any connector block. Therefore, a data processing system comprising this invention provides random module board locations. For example, random module boards 50 and 52 in FIG. 5 can be interchanged without altering system operation. That is, the module boards 50 and 52 can be interchanged without adversely affecting the operation of the system provided they are oriented properly in a connector block. Several keying and other locating arrangements exist to assure proper orientation.

In accordance with another object, this invention simplifies testing procedures, especially those performed in situ. Normally, there are several unused connector blocks adjacent to one another, while other adjacent connector blocks support the module boards as shown in FIG. 5. As any module board operates properly in any connector block, it can be installed in a vacant connector block and tested with the surrounding open space facilitating the attachment of leads from testing equipment.

It is also apparent that the adoption of this invention simplifies data processing manufacturing. The steps for forming the conductive layers 44, locating the terminal pins in the apertures and soldering the terminal pins 24 to conductive layers 44 are conventional and straightforward. This arrangement eliminates the need for the prior tedious point-to-point wiring and the requirements for identifying unique module board locations. It is only necessary to assure that the given module board is oriented properly with respect to any connector block.

As will be obvious to those skilled in the art, many modifications can be made to a wiring arrangement incorporating this invention. For example, in the disclosed embodiment, the circuit board 40 has conductive layers on both sides and the contact fingers in the connector blocks are connected to two rows of terminal pins. Both these features increase the effective connection density. On the other hand, if the system requires a reduced number of module board interconnections, the terminal pins could be spaced further apart or in a single line. If sufficient spacing exists, the circuit board 40 may only have conductive layers deposited on one side.

A number of factors usually limit the number of connector blocks in a single row mounted to a specific back circuit board 40. In many data processing systems, this is sufficient to accept all the module boards necessary. In other, larger systems, a number of back circuit boards equivalent to the circuit board 40 might be necessary. It will be apparent, however, from the foregoing description of this invention that such terminal boards can be simply interconnected. For example, a cable with terminal members adapted to be inserted in connector blocks might interconnect one connector block on each back circuit board to thereby interconnect the various back circuit boards.

Therefore, it is an object of the appended claims to cover all such objects and advantages which come within the true spirit and scope of this invention.

What I claim as new and desire to secure by Letters Patent of the United States is:

1. A data processing apparatus comprising:

A. a plurality of module boards adapted to send or receive selected signals, each module board having
   i. circuit means for sending or receiving certain of said selected signals,
   ii. a plurality of contact positions at least equal to the total number of selected signals, a corresponding contact position of each module board being assigned to only one of the selected signals, and
   iii. means for coupling a signal between its respective contact positions and circuit means when the module board has circuit means for receiving or sending that signal, B. a plurality of connector means, each connector means including
   i. means for supporting a module board,
   ii. a different contact means for engaging each module board contact position, and
   iii. a different terminal pin in circuit with each contact means and, thereby, each contact position on the module board supported by said connector means, and C. a plurality of conductive means, each conductive means interconnecting a corresponding terminal pin on each connector means whereby all corresponding coupling means on each of said module boards are connected to each other.

2. A data processing apparatus as recited in claim 5 wherein:

A. a corresponding terminal pin in each connector means is aligned in a row, and B. said interconnecting means comprises a connector board extending transversely with respect to said terminal pins, said connector board including:
   1. apertures through which said terminal pins pass, and
   2. a different conductor in circuit with each set of corresponding terminal pins.

3. A data processing apparatus as recited in claim 2 wherein conductors for adjacent rows of said terminal pins are formed on opposite sides of said connector board.

4. A data processing apparatus as recited in claim 3 wherein adjacent terminal pins are offset into columns, terminal pins in one column being in circuit with conductors on one side of said connector board and terminal pins in the other column being in circuit with conductors on the other side of said connector board.

* * * * *